(12) United States Patent
Mukherjee et al.

(10) Patent No.: US 6,760,389 B1
(45) Date of Patent: Jul. 6, 2004

(54) DATA RECOVERY FOR NON-UNIFORMLY SPACED EDGES

(75) Inventors: Shankar Ranjan Mukherjee, Cupertino, CA (US); Jules Joseph Jelinek, San Francisco, CA (US); Roy Thomas Myers, Jr., Santa Clara, CA (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 09/322,112

(22) Filed: May 27, 1999

Related U.S. Application Data

(60) Provisional application No. 60/087,606, filed on Jun. 1, 1998.

(51) Int. Cl.[7] .............................. H04L 7/00; H04K 1/00
(52) U.S. Cl. ....................................... 375/326; 375/371
(58) Field of Search ................................ 375/326, 360, 375/371, 373, 374, 355, 376; 327/91, 141, 144, 161, 147, 149, 150, 158, 159; 377/64, 75, 78; 331/2, 46

(56) References Cited

U.S. PATENT DOCUMENTS 4,972,430 A  * 11/1990  Cantwell ........................ 375/1
5,566,204 A  * 10/1996  Kardontchik et al. ........ 375/219
5,761,254 A  *  6/1998  Behrin ......................... 375/355
5,977,821 A  * 11/1999  Shibata ....................... 329/306
5,999,576 A  * 12/1999  Lee ............................. 375/333

* cited by examiner

*Primary Examiner*—Mohammad H. Ghayour
*Assistant Examiner*—Dung X. Nguyen

(57) ABSTRACT

A shared data and clock recovery circuit including a clock synthesizer for generating sampling signals having different phases, a multiple transition detector for receiving a data stream and sampling signals, and for detecting edges in a data stream in response to the sampling signals, a counter and accumulator for detecting the time occurrences and total number of edges, and for performing weighted average calculation to select one of the phases, a decision circuit for detecting the phase difference between a source clock and a local clock such that if the PPM difference between the source clock and the local clock is at least 200 PPM, then selection of a phase is based upon stored historical information, and if the PPM difference between the source clock and the local clock is less than 200 PPM, then selection of a phase is based on a weighted averaging calculation.

12 Claims, 9 Drawing Sheets

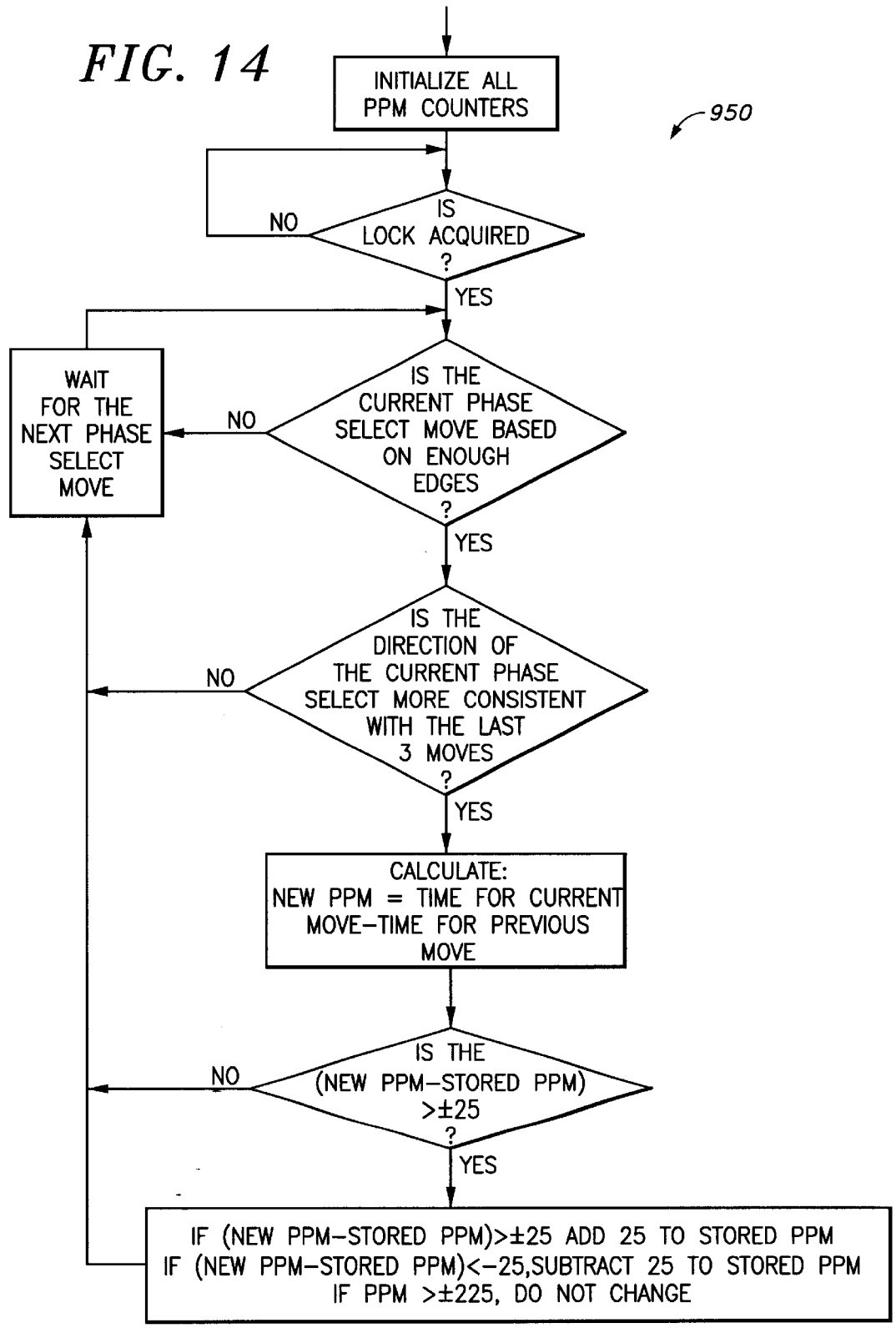

DATA RECOVERY FOR NON-UNIFORMLY SPACED EDGES

CROSS-REFERENCES TO RELATED PATENT APPLICATIONS

This application claims the benefit of U.S. Provisional Patent Application Serial No. 60/087,606, filed Jun. 1, 1998.

This patent application incorporates herein by reference U.S. patent application Ser. No. 09/323,170, filed May 27, 1999 entitled "Shared Data and Clock Recovery Using Edge Sampling Techniques" and U.S. patent application Ser. No. 09/322,122, filed May 27, 1999 entitled "Shared Data and Clock Recovery for Packetized Data."

BACKGROUND OF THE INVENTION

1. Field of the Invention

The present invention relates generally to high-speed digital data transmission systems and more specifically to a circuit and method for data recovery for non-uniformly spaced data.

2. Description of the Background Art

In conventional digital communication systems, electronic information is transferred between a transmitting unit and a receiving unit over a communications channel, such as a transmission line. The electronic information is commonly transmitted in the form of data bits, with each bit being a binary "0" (hereinafter simply "0") or a binary "1" (hereinafter simply "1"). The "0" and "1" values can, for example, represent low and high voltages, respectively.

The transferred electronic information is further characterized by a fundamental bit rate, i.e., the clock frequency of the data bits. In synchronous transmission typically used in computer-to-computer communication, for example, the receiving unit determines the clock frequency of the transmitting unit (e.g., for decoding purposes) by deriving a clock signal from timing information of the transmitted data bits. This process is known as clock recovery. The recovered clock signal enables the receiving unit to optimally sample the received digitally encoded electronic information during the decoding process.

Clock recovery circuits are commonly employed, for example, in conjunction with Local Area Networks (LANs) and point-to-point communication links. A conventional clock recovery circuit typically employs phase-locked loops (PLLs). A typical PLL has a voltage-controlled-oscillator (VCO) whose phase will lock onto a frequency component of the PLL input signal from the destination clock generator. The PLL also has a phase detector for comparing the phase of the VCO with the phase of the PLL input signal, and for developing a voltage proportional to the phase differential, which commonly is referred to as a "phase error." This voltage is filtered and applied as a control voltage to the VCO to adjust the VCO's frequency. Due to negative feedback, the phase error is driven to a preferably small value, and the VCO's frequency consequently becomes equal to the PLL input frequency. PLL circuits are further shown and described in Best, R. E., *Phase-Locked Loops Theory, Design, and Application*, McGraw-Hill Book Company, New York, N.Y. (1993); Razavi, Behzad, *Monolithic Phase-locked Loops and Clock Recovery Circuits, Theory and Design*, IEEE Press, New York, N.Y. (1996); Gardner, Floyd M., *Phaselock Techniques*, John Wiley & Sons (1979); and Haung, H. M., Banatao, D., Perlegos, G., Wu, T. C., and Chiu, T. L., *A CMOS Ethernet Serial Interface Chip*, IEEE International Solid-State Circuits Conference Digest (1984).

Data and clock recovery circuits using the "one-shot" method are shown and described in Bell, A. G., Borriello, G., *A Single Chip NMOS Ethernet Controller*, IEEE International Solid-State Circuits Conference Digest (1983), which is incorporated herein by reference. Clock and data recovery circuits are also shown and described in U.S. Pat. No. 5,056,118 issued to Sun on Oct. 8, 1991; U.S. Pat. No. 5,103,466 issued to Bazes on Apr. 7, 1992; in U.S. Pat. No. 5,164,966 issued to Hershberger on Nov. 17, 1992; U.S. Pat. No. 4,853,943 issued to Laws on Aug. 1, 1989; and U.S. Pat. No. 4,841,257 issued to Morrison et al. on Jun. 20, 1989.

Various analog approaches exist for data and clock recovery. For example, in U.S. Pat. No. 5,124,669 to Palmer et al., a clock recovery circuit using a PLL is shown and described. A one-shot circuit is coupled to the PLL to enable the phase detector when the data stream does not consist of uniformly spaced pulses. Without a one-shot circuit, the phase detector in the PLL generates a large error signal whenever a clock pulse occurs without a data pulse. During the times when the phase detector is enabled, a phase comparison is made between the next data pulse edge and the next clock pulse edge. When this comparison is completed, the phase detector is disabled again. In order for the PLL to average out the effects of noise and jitter, the phase detector is enabled at one half of a clock period before the data edge. By doing this, the data edge can shift up to one half of a clock period before the phase detector generates an incorrect error signal. If the data edge is shifted further than one half of a clock period, then the data edge is compared to a different rising clock edge and the detector generates an error. The one-shot circuit has been designed to generate a delayed data signal whose rising edge is used to enable the phase detector, and whose falling edge is compared with the clock edge for disabling the phase detector.

However, the circuit of Palmer would cause erroneous data and/or clock recovery if a data stream edge (transition) does not occur within a significant time length, such as 60 bit times. In addition, PLLs in conventional data and clock recovery systems tend to drift if an edge-starved pattern (a period of time when the number of data edges is far below the expected or average number of edges) appears in the data stream. This drift causes the PLL to become out of phase with the source clock phase and frequently results in erroneous data recovery.

Traditional PLLs tend to drift in edge-starved situations due to either too much gain resulting in too much or too little gain resulting in too slow a response. In the prior art, edge-starvation has been dealt with by reducing the loop gain and accepting a slower response in order to avoid the instability of over-correction resulting from high loop gain.

Additionally, wobble (where high jitter levels exist in the data and the PLL gain cannot be sufficiently controlled) can occur in analog PLL approaches to clock and data recovery. Jitter is typically a result of instantaneous noise injection in the communications system, or a result of transmission cable imperfections, or a result of source clock imperfections, and/or a result of other electrical behavioral characteristics. Conventional PLL-based clock/data recovery systems tend to lock on the jittered bits and accordingly perform unnecessary phase adjustments. This tendency causes a traditional PLL to go out of phase with the source clock phase during periods of edge-starvation.

Thus, what is needed is a novel data and clock recovery circuit and method that will overcome the foregoing deficiencies.

SUMMARY OF THE INVENTION

An object of the present invention is to provide a clock frequency tracking mechanism which will more closely track the actual clock frequency used in a network. The invention has the advantage of using the PLL with a reduced sensitivity that meets the needs of tracking the clock frequency of a network.

The shared data and clock recovery circuit includes a source clock, a destination clock, a clock synthesizer, for generating sampling signals having different phases, a multiple transition detector for receiving a data stream and sampling signals, a counter/accumulator for detecting the time occurrences and total number of edges, and for performing a weighted averaging calculation and outputting a signal reflecting the weighted averaging to select one of the different phases, and a circuit to track and digitally store the parts-per-million (PPM) frequency difference between the source clock and the destination clock.

BRIEF DESCRIPTION OF THE DRAWINGS

FIG. 14 is a flowchart which illustrates operation of a mechanism which tracks the PPM difference between a source clock and a destination clock.

DETAILED DESCRIPTION OF THE INVENTION

The invention has several advantages. It is easy to change and port new digital recovery algorithms. It results in a circuit complexity and area reduction by a factor of three from the prior art circuits. Additionally, a power and chip area reduction is achieved in receiving multiple channels by not requiring multiple copies of the clock synthesizer circuitry. Only the logic state machine portion needs to be replicated for multiple channel applications.

Figure 1:
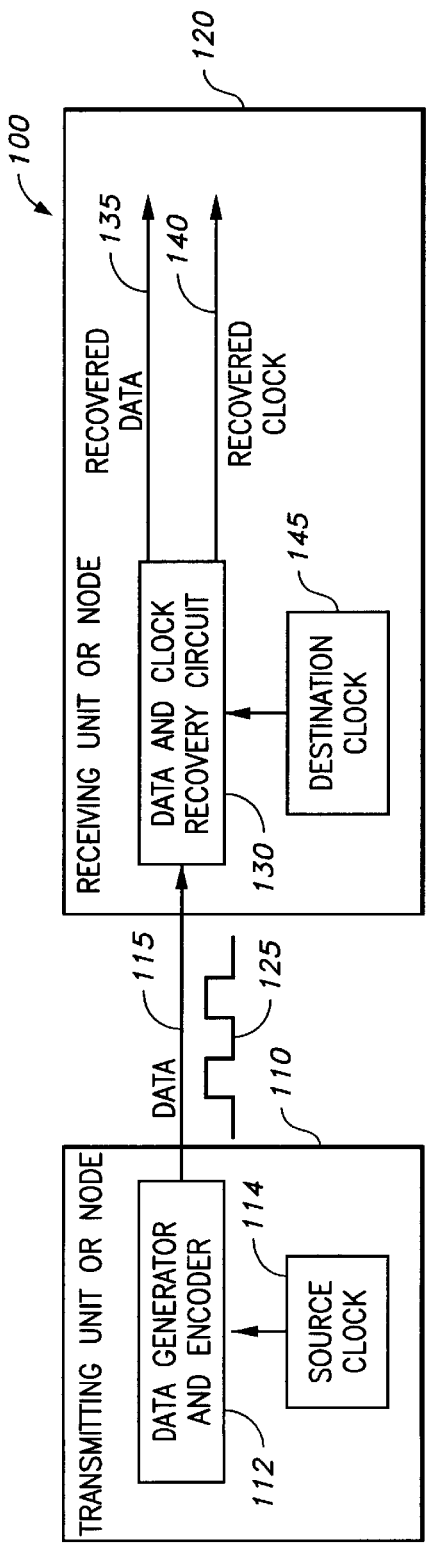
FIG. 1 shows a digital communications system.

FIG. 1 shows an exemplary digital communications system, 100 which includes a transmitting unit or node 110 coupled by a transmission channel 115 to a receiving unit or node 120. The transmitting unit 110 includes a data generator and encoder 112 for generating the data stream 125 to be transmitted across the transmission channel 115. In addition, a source clock 114 is connected to the data generator and encoder 112 for providing timing information to the data stream 125.

The transmission channel 115 is typically unshielded twisted pair wiring, but may also be shielded twisted pairs, attachment unit interface (AUI) cables, copper distributed data interface (CDDI), coaxial transmission lines, or other types of wiring. Additional details on CDDI (FDDI) are discussed in *Fibre Distributed Data Interface (FDDI)— Part: Token Ring Twisted Pair Physical Layer Medium Dependent (TP-PMD)*, American National Standard For Information Systems (Mar. 1, 1995) and in U.S. Pat. No. 5,305,350 to Budin et al. on Apr. 19, 1994, all are fully incorporated herein by reference.

The data stream 125 may, for example, have non-return-to-zero inverted (NRZI) encoding or non-return-to-zero (NRZ) encoding. As known to those skilled in the art, NRZI and NRZ coding do not contain imbedded clock signals. Alternatively, the data stream 125 may be phase encoded (i.e., data containing imbedded clock signals). Additional details on the several types of phase encoding schemes are shown and described in the above Bazes patent, fully incorporated herein by reference. Phase encoding schemes include the following: (i) bi-phase-level encoding ("Manchester encoding"), (ii) bi-phase-mark encoding (frequency-modulation or FM), and (iii) delay-modulation ("Miller encoding" or Modified FM (MFM)), and (iv) amplitude multi-level coding (MLT3). Manchester encoded waveforms are shown and described in the above Laws patent, fully incorporated herein by reference.

The data stream 125 is susceptible to being corrupted to varying degrees after propagating across the transmission channel 115 due to additive noise, inter-symbol interference (ISI), and/or jitter. In the receiving unit 120, an equalizer (not shown in FIG. 1) receives the transmitted signal 125 for generally reducing ISI and for compensating for amplitude and phase distortion introduced in transmission.

The data stream 125 is received by the data and clock recovery circuit 130 in accordance with the present invention. Two preferred embodiments 130a and 130b of this data and clock recovery circuit 130 are shown in additional detail in FIG. 2 and FIG. 3, respectively. The data and clock recovery circuit 130 outputs the recovered data via line 135 and the recovered clock signal via line 140. Additionally, a destination (or local) clock 145 functions with the data and clock recovery circuit 130 in the clock recovery of the data stream 125.

Figure 2:
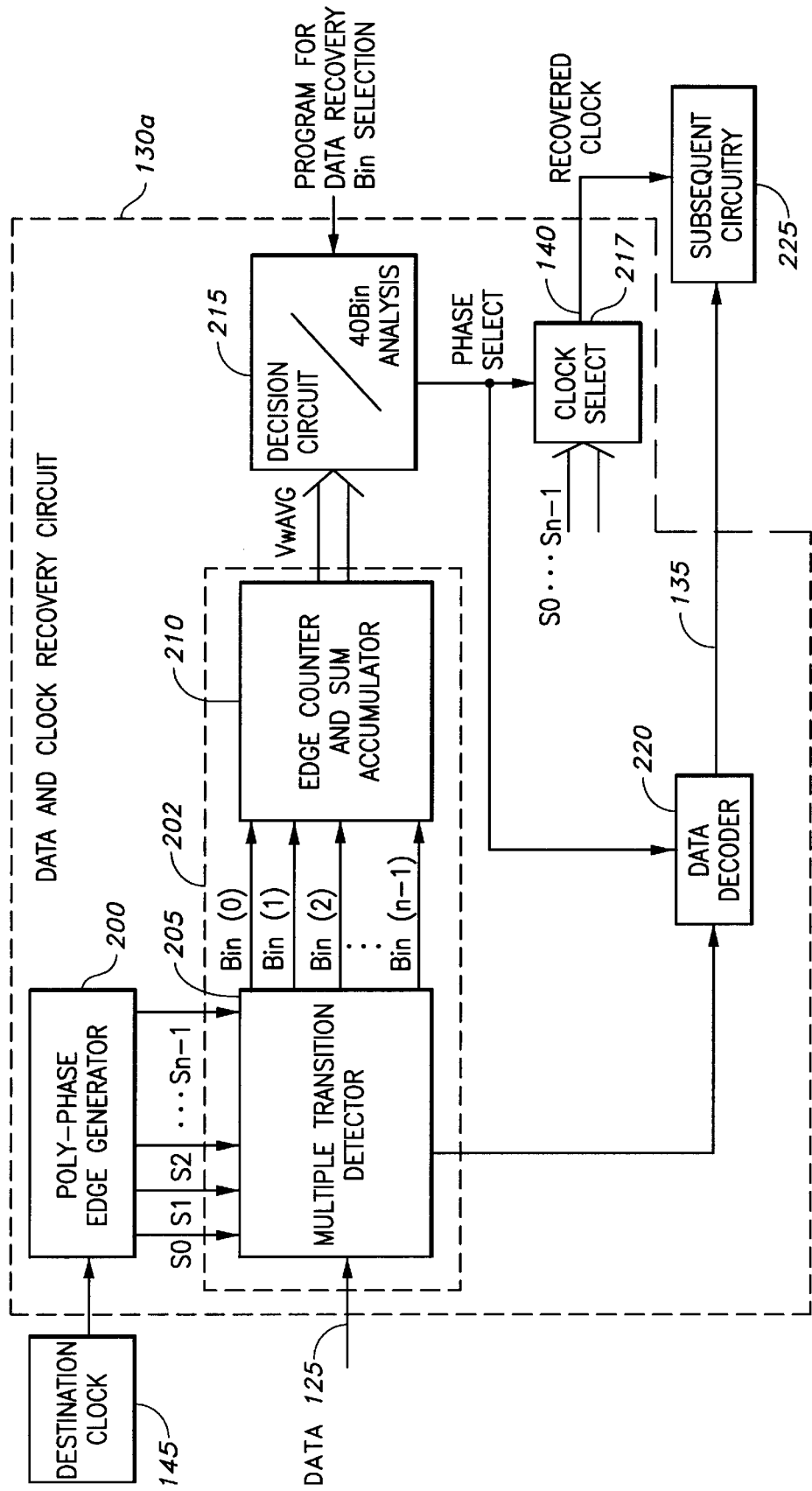
FIG. 2 shows one embodiment of a data and clock recovery circuit.

FIG. 2 shows a data and clock recovery circuit 130'. A poly-phase edge generator or n-phase clock synthesizer 200 is connected to the destination clock 145 and outputs n-equally spaced clock edges/cycles (or sampling signals) S0 . . . Sn−1 to a sampling circuit 202. The sampling circuit 202 also receives the data stream 125 and includes a multiple transition detector 205 the outputs of which are coupled to an edge counter and sum accumulator 210. The multiple transition detector 205 receives the clock edges S0 . . . Sn−1 and the data stream 125. Conventional transition detectors are also shown and described in U.S. Pat. No. 5,276,712 to Pearson and fully incorporated herein by reference.

Upon receiving the data stream 125 and the n-equally spaced clock edges S0 . . . Sn−1 (from the clock synthesizer 200), the multiple transition detector 205 outputs the Bin(0)

... Bin(n–1) signals to the counter/accumulator 210. The counter/accumulator 210 then performs weighted averaging of the signals Bin(0) ... Bin(n–1), and outputs to a decision circuit 215 a binary number representing the relative position of the incoming data with respect to the current position, which is the currently selected phase of the n-phase clock synthesizer. Based on this binary number, the decision circuit 215 outputs a "phase select" signal to a clock select circuit 217, the output of which is the recovered clock signal on line 140. In response to the "phase select" signal, the clock select circuit 217 selects one of the clock edges S0 . . . Sn–1 and outputs the selected clock edge as a recovered clock signal to a data decoder 220 so that data recovery is performed. The data decoder 220 also receives the data stream from the transition detector 205. The recovered data is then transmitted via line 135 to a subsequent circuitry stage 225, which also receives the recovered clock.

Figure 3:
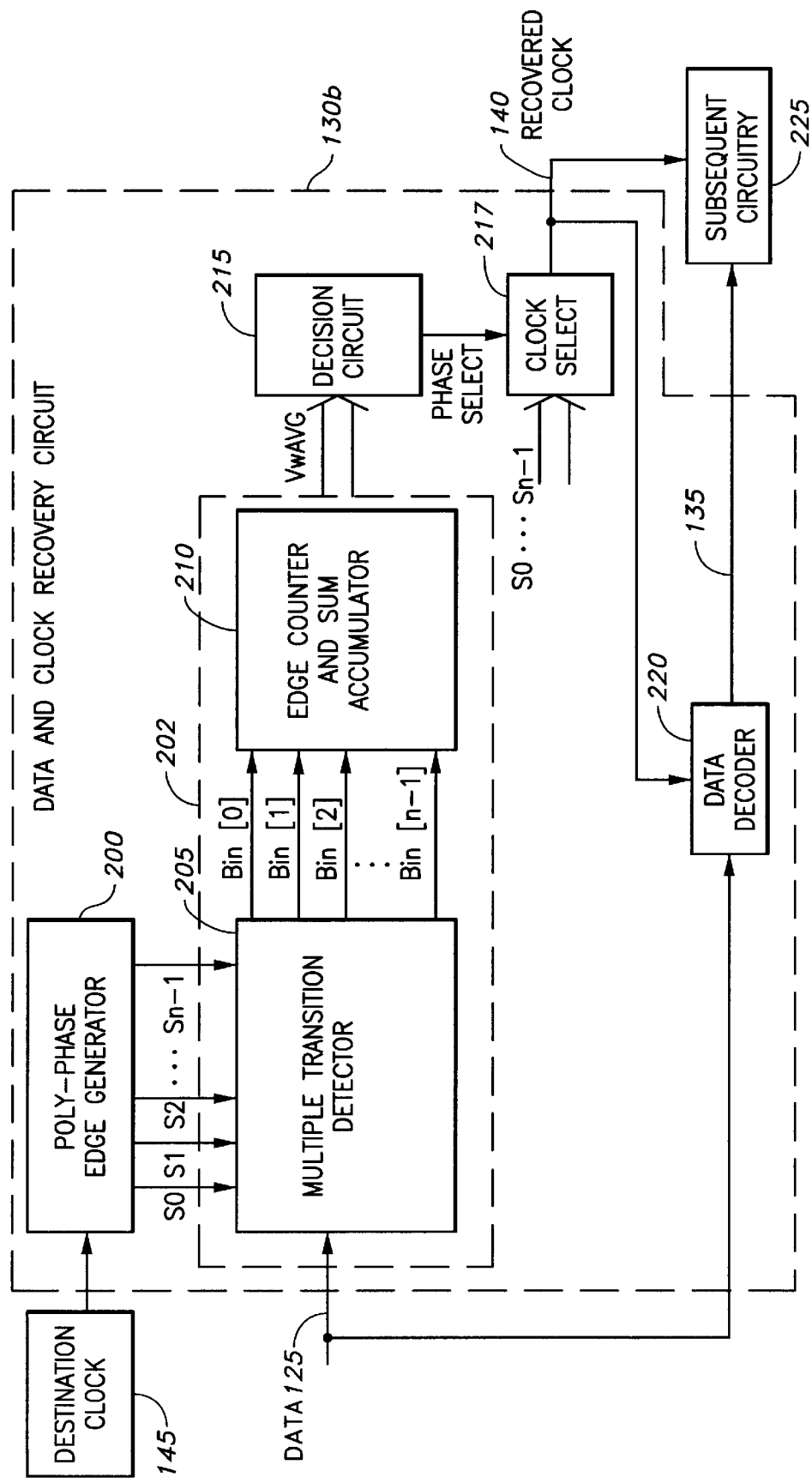
FIG. 3 shows another embodiment of a data and clock recovery circuit.

Those skilled in the art will realize that certain implementations of the multiple transition detector 205 will require a re-synchronization circuit to be implemented in the data and clock recovery circuit 130a and 130b (see FIGS. 2 and 3).

FIG. 3 shows a data and clock recovery circuit 130b according to another embodiment of the present invention. In this embodiment, the data decoder 220 receives the sampled data 125.

Figure 4:
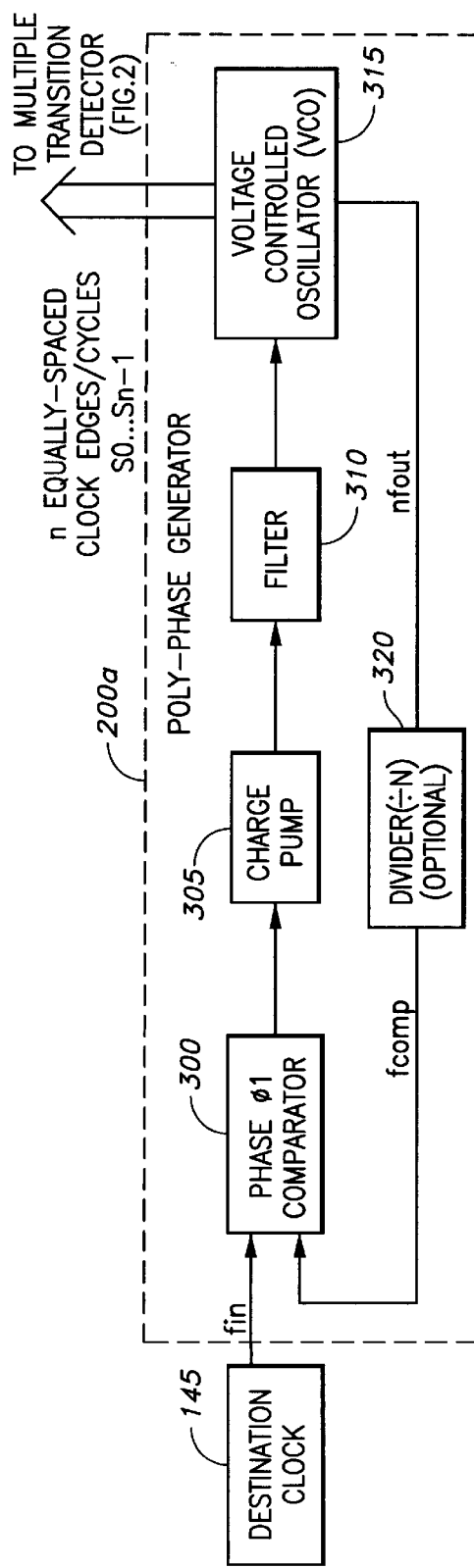
FIG. 4 shows a phase-locked loop that is one embodiment of a clock synthesizer according to the present invention.

FIG. 4 shows a phase-locked loop 200a, a preferred embodiment of a clock synthesizer 200 (of FIGS. 2 and 3), which includes a phase comparator 300, a charge pump 305, a low pass filter 310, a voltage-controlled oscillator (VCO) 315, and a divider (or divide-by-n circuit) 320. As known to those skilled in the art, the divider 320 is an optional component of the phase-locked loop 200a. Examples of divide-by-n circuits are also discussed in Horowitz, Paul and Hill, Winfield, *The Art Of Electronics* (2$^{nd}$ ed.), Cambridge University Press, New York, N.Y. (1996); and in Giacoletto, L. J. (editor), *Electronics Designers' Handbook* (2$^{nd}$ ed.), McGraw-Hill Book Company, New York, N.Y. (1977), all fully incorporated herein by reference. The phase comparator circuit 300 compares the $f_{comp}$ frequency generated by the divider 320 to the $f_{in}$ frequency generated by the destination clock 145. As a result of this comparison, the phase comparator 300 outputs the appropriate voltage to the charge pump 305 such that the VCO 315 can accordingly increase or reduce the oscillating frequency $f_{out}$. The phase-locked loop 200a eventually causes the $f_{comp}$ and $f_{in}$ to reach the same value at a certain point in time. If so, the VCO 315 becomes stable. As shown in FIG. 3, the VCO 315 also generates the n-equally-spaced clock edges (sampling signals) S0 ... Sn–1 (of FIGS. 2A and 2B). Other examples of circuits or systems which may be used as clock synthesizers 200 include, but not limited to, delay lock loops, RC delay networks, and precision delay lines.

Figure 5:
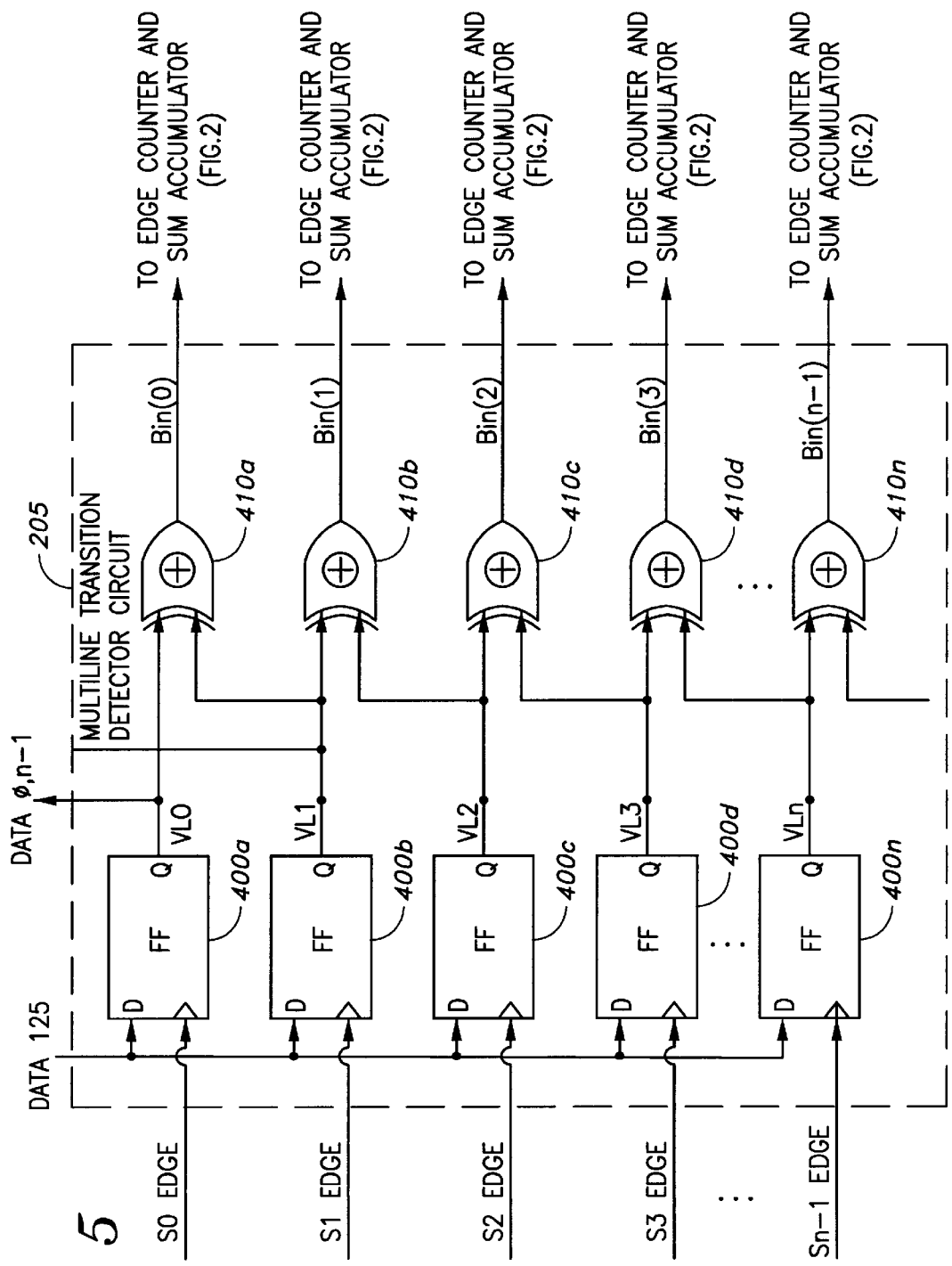
FIG. 5 shows one example of a multiple transition detector circuit according to the present invention.

FIG. 5 shows one example of a multiple transition detector circuit 205 according to the present invention. The multiple transition detector circuit 205 includes a plurality of sampling flip-flops 400a, 400b, ... 400n. Additional sampling flip-flops may be added in the multiple transition detector circuit 205 based on the networking scheme used and on design requirements. For example, a ten-megabit networking scheme will require additional flip-flops for the multiple transition detector circuit 205. Each of the flip-flops 400a ... 400n receives the data stream 125 and the respective edges (sampling signals) S0 ... Sn–1. The multiple transition detector circuit 205 also includes the Exclusive-OR (XOR) gates 410a ... 410n. Additional XOR gates may be added in the multiple transition detector circuit 205 if additional flip-flops are implemented.

As shown in FIG. 5, the XOR gate 410a has its first input terminal connected to the output terminal of the flip-flop 400a and its second input terminal connected to the output terminal of the flip-flop 400b. The XOR gate 410b has its first input terminal connected to the output terminal of the flip-flop 400b and its second input terminal connected to the output terminal of the flip-flop 400c. The other XOR gates are similarly connected. The flip-flops 400a ... 400n generate the sampled signals, VL0 ... VLn, respectively.

The XOR gates 410a ... 410n have output terminal connected to the edge counter and sum accumulator 210 (FIGS. 2A and 2B) for outputting the signals Bin(0) ... Bin(n–1), respectively. FIG. 4 illustrates only a portion of the multiple transition detector circuit 205 to avoid overcrowding the diagram. Additional flip-flops and XOR gates are included in the circuit 205 and are represented by ellipses shown in FIG. 4.

Figure 6:
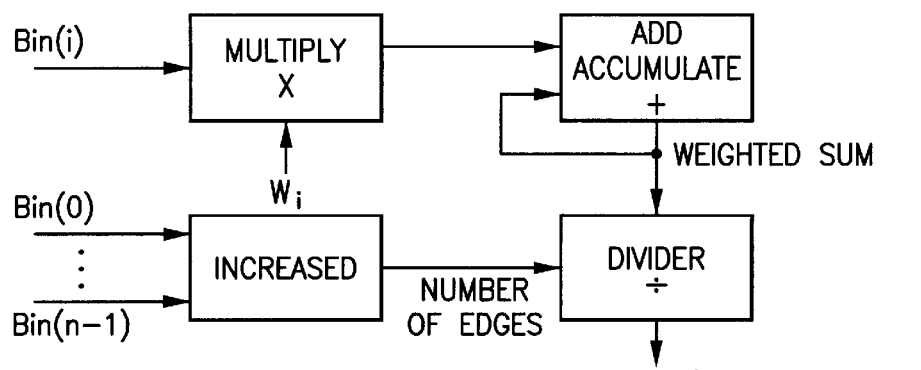
FIG. 6 shows a schematic logic diagram of the edge counter and sum accumulator 210 for performing the weighted averaging function.

FIG. 6 shows a schematic logic diagram of the edge counter and sum accumulator 210 for performing the weighted averaging function. Any time there is an edge occurrence detected in any of the inputs Bin(0) ... (n–1), a count value associated with the particular bin (Bin(0) ... (n–1)) is incremented. Thus, within a known period of time, the counter/sum accumulator keeps track of the number of edge occurrences in any bin, Bin(0) ... (n–1). Each bin has associated weights assigned to it. So the weighted average, $V_{AVG}$ is calculated as:

$$V_{AVG} = \frac{\sum_{i=0}^{n-1} wi \cdot ni}{\sum_{i=0}^{n-1} ni} = \frac{\text{weighted sum}}{\text{number of edges}}$$

Where wi=weight assigned to Bin(i)

ni=Number of edge occurrences in Bin(i)

Figure 7:
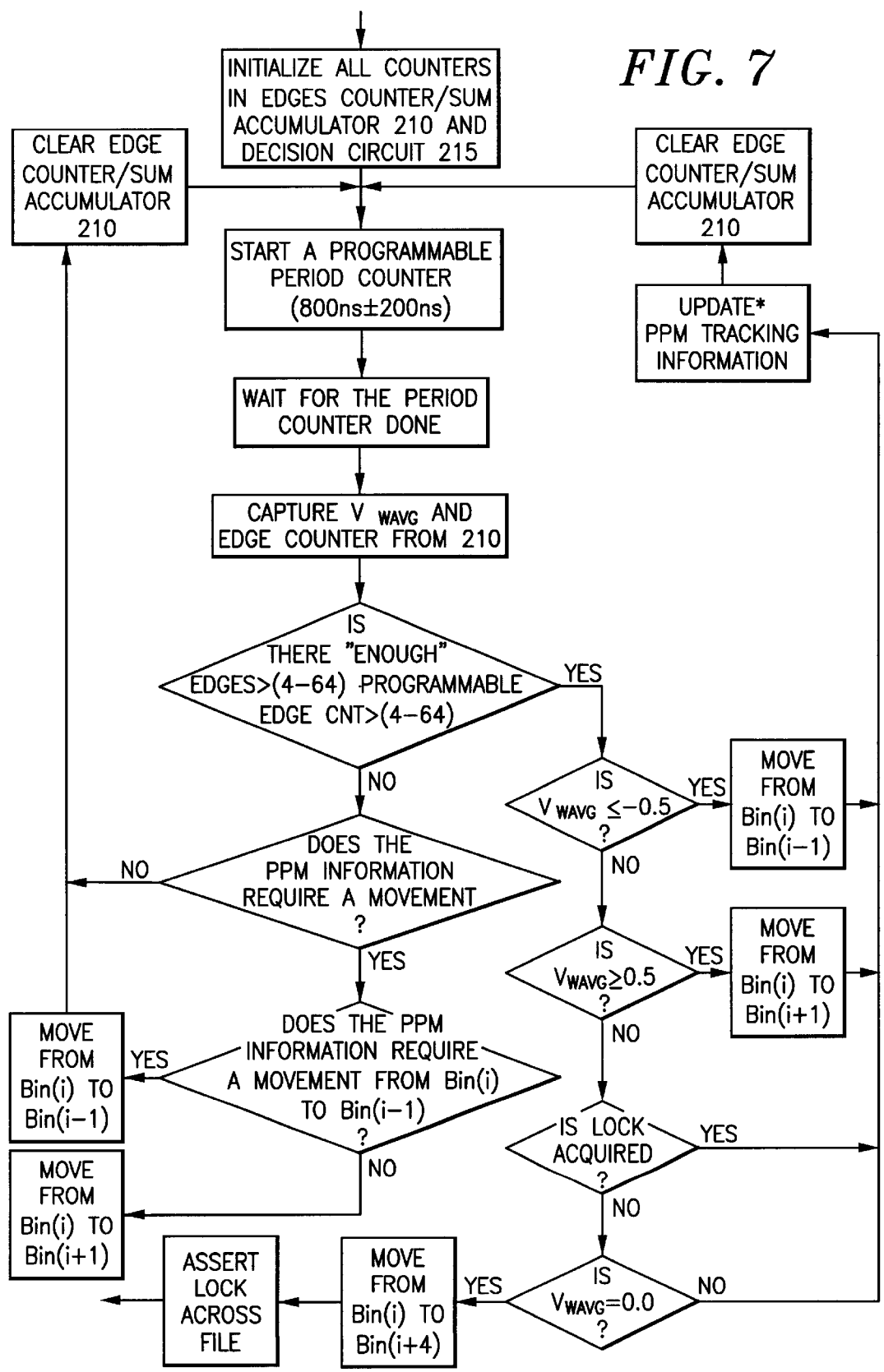
FIG. 7 shows a decision circuit in accordance to a preferred embodiment of the present invention.

FIG. 7 shows the decision circuit 215 in accordance to a preferred embodiment of the present invention. The decision circuit samples the $V_{wavg}$ periodically and the total number of edges accumulated during that period. The preferred sampling period is 800 ns. If there is not enough edges during this period then it becomes an "edge-starved period" and is handled using PPM tracking circuitry described later. For fast Ethernet, CDDI, or FDDI applications, preferred number of enough edges is 4–10 during a period of 800 ns. If the sampling period of 800 ns is changed, then the number of enough edges needs to be adjusted accordingly. If the $V_{wavg}$ indicates a value $\leq -0.5$, then the phase select is changed such that clock select circuit 217 moves the recovered clock from Si to Si-1 and the recovered data from the data decoder 220 is moved from Bin (i) to Bin (i–1). If the $V_{wavg}$ indicates a value $\geq +0.5$, then the phase select is changed such that clock select circuit 217 moves the recovered clock from Si to Si+1 and the recovered data decoder 220 is moved from Bin (i) to Bin (i+1). If $-0.5 \leq V_{wavg} \leq 0.5$, then nothing moves. During the initial locking period, if the phase select has resulted in $V_{wavg}=0.0$, the decision circuit moves quadrature (in this case, four phases away) and comes back to the ideal lock position of $V_{wavg}=0.0$. This is done only once after any reset operation to the decision circuit 215. This is done in order to avoid the highly unlikely condition of no PPM difference between the source clock and the destination clock and the ideal lock is actually in Bin (i+n/2) instead of Bin (i).

OPERATION OF THE INVENTION

Figure 8:
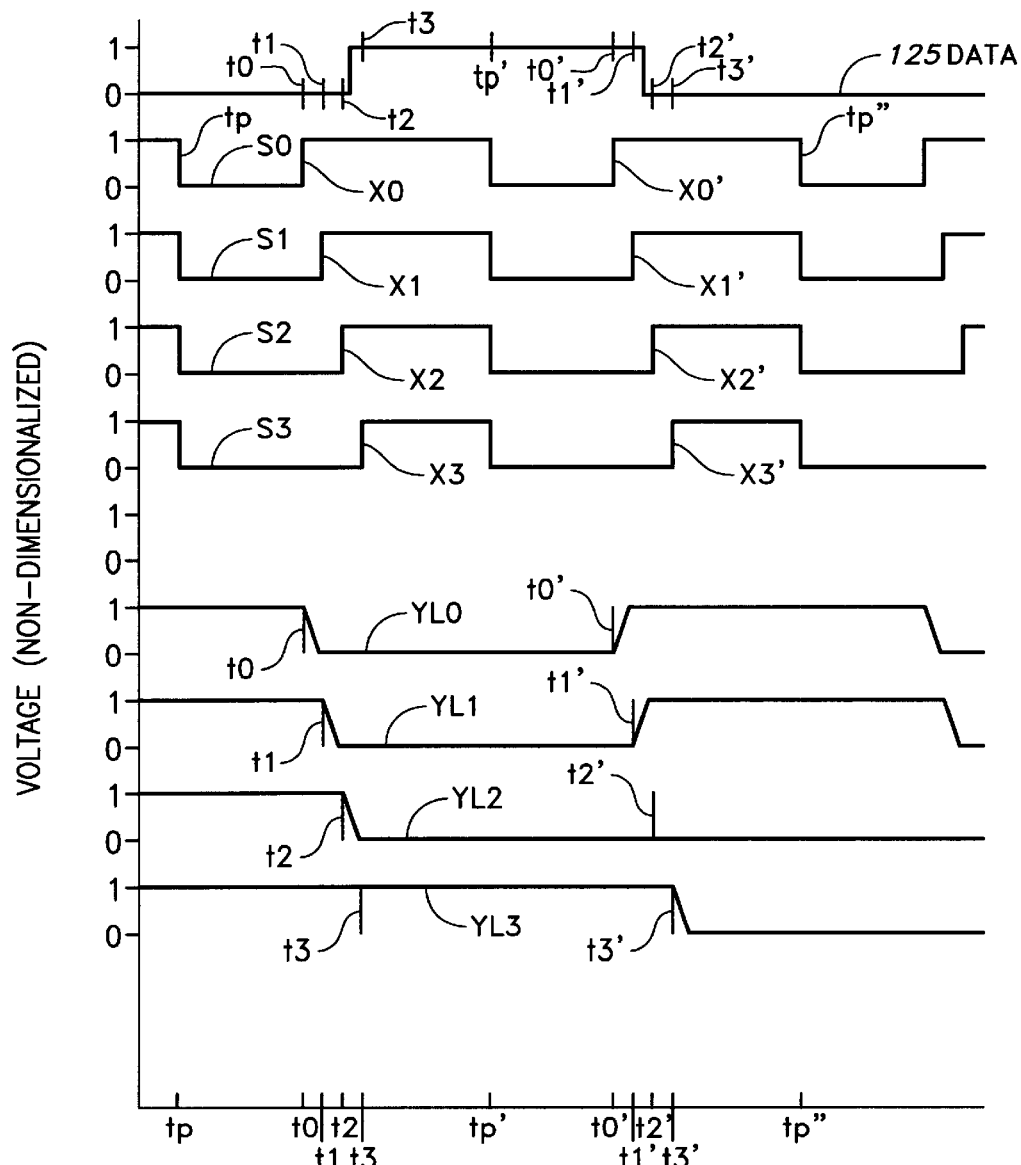
FIG. 8 shows the operation of the invention and the method for clock recovery based on edge sampling and weighted-averaging.

Reference is now made initially to FIG. 8 for the operation of the invention and the method for clock recovery based on edge sampling and weighted-averaging. The upper signal, DATA 125, represents the data stream 125. Assuming the DATA 125 signal is NRZ or NRZI encoding, the multiple transition detector 205 (FIG. 5) focuses on the DATA 125 bit boundaries in generating the data samples VL0 . . . VLn. The next four signals represent four of the sampling signals S0 . . . S3. The sampling signals S4 . . . Sn-1 have been omitted in FIG. 6 to avoid overcrowding drawing.

In the example shown in FIG. 8, the first fill DATA 125 bit is a "1." At times t0–t3, low-to-high transitions X0–X3 in respective sampling voltages S0–S3 occur in the vicinity of the beginning of the first full bit. The time between the sampling voltage transitions (i.e., time between, e.g., X0–X1) may, for example, be about 0.5 ns. In FIG. 8, the instantaneous values of the DATA 125 signal at times t0–t3, respectively, are 0001. The transitions X0–X3 cause these instantaneous values to be loaded into the respective flip-flops 400a–400d so that data samples V0–VL3, respectively, provide 0001 during the first sampling period wherein each sampling period has a time length set at for example, about 8.0 ns. The sampling period time length can be programed by a circuit that uses the bin size to determine the sampling period time length.

The second full DATA 125 bit in FIG. 8 is a "0." In the vicinity of the beginning of this second-full bit, the sampling signals S0–S3 respectively make low-to-high transitions X0'–X3' at times t0'–t3'. The time between the sampling voltage transitions (e.g., time between X0'–X1') may, for example, be about 0.5 ns. The instantaneous values of the DATA 125 signal respectively are 1100 at times t0'–t3' in the illustrated example. The sampling performed with the sampling signals S0–S3 at transitions X0'–X3' causes the data samples VL0–VL3 to be respectively provided as 1100 during the second sampling period.

As shown above, VL0 . . . VL1 will have values for each sampling period. Based on the VL0 . . . VLn values for each sampling period, the XOR gates 410a . . . 410n responsively output the signals Bin(0) . . . Bin(n-1), respectively. One of the signals Bin(0) . . . Bin(n-1) will have a "1" value to reflect the occurrence of a transition in the DATA 125 signal. For example, in FIG. 6, a DATA 125 transition occurs between t2 and t3. Thus, VL2 will be a "0" while VL3 will be a "1." The XOR gate 410c will thus output a Bin(2) signal with a value of "1." Since transitions did not occur at other times, the signals Bin(0), Bin(1), and Bin(3) . . . Bin(n-1) will each have a value of "0".

Figure 9:
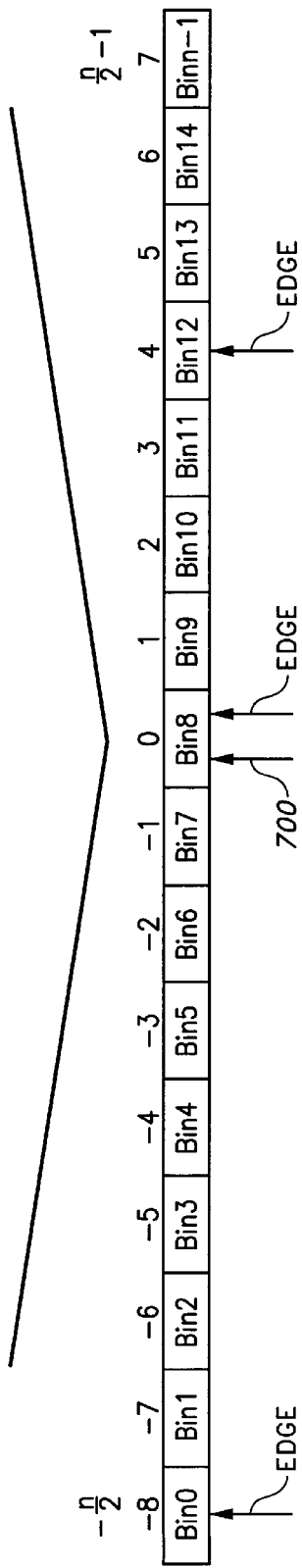
FIG. 9 shows each bin BIN0 . . . BIN15.
Figure 10:
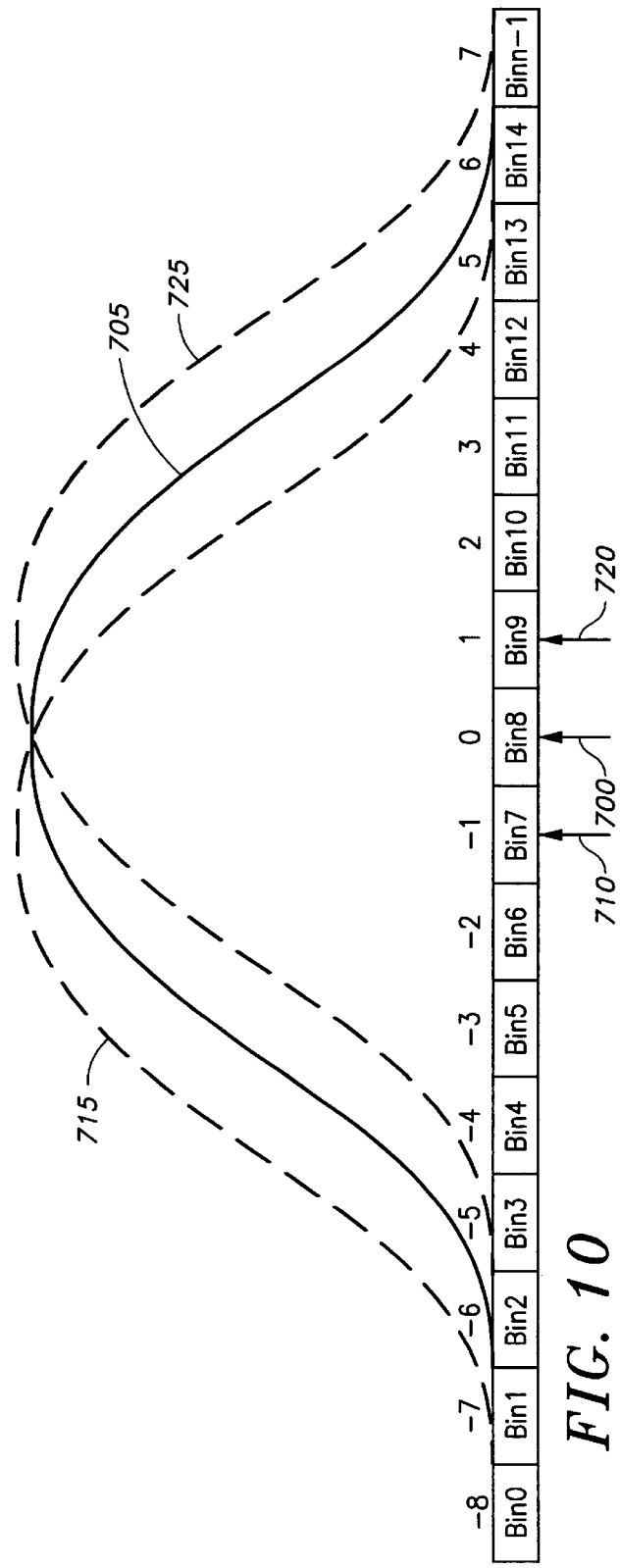
FIG. 10 shows each bin in the BIN0 . . . BIN15 configuration and how the sampling is centered around BIN8.

Reference is now made to FIGS. 9 and 10 to further discuss clock recovery based on edge sampling and weighted averaging. In the example of FIGS. 9 and 10, each of the bins BIN0 . . . BIN15 corresponds to a phase setting of the destination clock 145 (FIGS. 1 and 2). It will be appreciated from the teachings of the present invention that the FIGS. 9 and 10 example can be modified to add additional bins. Thus, for a one-hundred megabit networking scheme, the bins BIN0 . . . BIN15 may, for example, be implemented. For a ten megabit networking scheme, BIN0 . . . BIN39 (i.e., 40 bins) may be implemented. For the one-hundred megabit networking scheme, each of the BIN0 . . . BIN15 is sized at 5 ns.

FIG. 10 is shown for defining each bin in the BIN0 . . . BIN15 configuration. Assume that the initial phase of the clock select 217 corresponds to BIN8, as represented by the arrow 700. A clock select 217 phase, which is positioned at BIN8, will have a Gaussian distribution represented by curve 705. As shown in FIG. 4A, this Gaussian distribution is measured by the logic elements of the edge counter and sum accumulator 210.

The counter/accumulator 210 detects the transitions (edges) occurring in the DATA 125 signal (FIG. 8) for every sampling period of 8.0 ns. Each edge occurrence is then recorded and statistically gathered by a corresponding bin which functions as a statistical counter. The time (within the 8.0 ns sampling period) in which the edge occurs determines which of the BIN0 . . . BIN15 records the edge occurrence. Each of the bins BIN0 . . . BIN15 defines, for example, a 0.5 ns time frame. The sum of all bins BIN0 . . . BIN15 time frames equals the 8.0 ns sampling period. Thus, if a bit edge occurs within the first 0.5 ns, then BIN0 will accordingly record this edge. As shown in FIGS. 5 and 8, if a DATA 125 transition occurs between t2 and t3, then the sampling flip-flops 400a . . . 400n are able to record this transition occurrence. Accordingly, the Bin(2) signal will be a "1" in response to the transition occurrence between t2 and t3. This Bin(2) value of "1" is then statistically gathered by BIN2. Similarly, if a DATA 125 edge transition occurs at another time different from the t2–t3 frame, then one of the Bin(0) . . . Bin(n-1) will appropriately have a "1" value which is recorded by a bin corresponding to the time frame in which the edge transition occurred.

In the example shown in FIG. 9, if BIN8 is assumed to correspond to the initial phase of the clock select 217, then the following bins are assigned corresponding values: BIN0=-8, BIN1=-7, BIN2=-6, BIN3=-5, BIN4=-4, BIN5=-3, BIN6=-2, BIN7=-1, BIN8=0, BIN9=1, BIN10=2, BIN11=3, BIN12=4, BIN13=5, BIN14=6, and BIN15=7. It follows from the teachings of this invention that the above bin values will differ if the initial phase of the clock select 217 corresponds to a different bin (e.g., BIN9). Thus, if clock select 217 is set at an initial phase corresponding to BIN9, then the BIN9 value would be set equal to "0."

The invention will detect and record (via BIN0 . . . BIN15) all edges occurring within a decision period of a programmable time length. For example, for the sixteen (16) bin configuration of FIG. 7, the decision period may be set to 314 bit times wherein each bit time is 8.0 ns long. Thus, the decision period may vary depending on the networking scheme used and on design requirements. The decision period time length is preferably set such that sufficient edge occurrences are recorded by the bins, thereby permitting the calculated weighted average to accurately reflect the edge distribution in a data stream 125.

FIG. 9 shows an example of edges occurring within a decision period of 314 bit times for the one hundred megabit networking scheme. Assume that the edges are recorded by the bins BIN0, BIN8, and BIN12. These edge occurrences are represented in FIG. 9 as arrows labeled "EDGE." As stated above, the bins BIN0 . . . BIN15 will record edge occurrences based on which of the Bin(0) . . . Bin(15) signals have a value of "1." A weighted average value can be calculated based on equation (1) and, as shown below, used for adjusting the clock select 217 phase setting to permit proper data recovery.

$$\text{weighted average} = (\text{weighted sum})/(\text{number of edges}) \quad (1)$$

The parameter "weighted sum" is the sum of the values of the bins that record edge occurrences in the DATA 125 signal during a decision period. The parameter "number of edges" is the sum of the number of edges of the DATA 125 signal which occur within the decision period. In the example of FIG. 9, the weighted sum is given by equation (2).

$$\text{weighted sum}=(\text{BIN0 value})+(\text{BIN8 value})+(\text{BIN12 value})=-8+0+4=-4 \quad (2)$$

The number of edges which occurred during the decision period is three (3), as represented by the arrows labeled "edges." Thus according to equation (1), the weighted average is calculated as shown in equation (3).

$$\text{weighted average}=-4/3=-1.33 \quad (3)$$

The weighted average value of −1.33 in equation (3) instructs the decision circuit 215 (FIGS. 2 and 3) to move the clock select 217 phase setting at minus one (−1) bin positions after the end of the decision period, assuming the parts-per-million (PPM) difference between the source clock 114 and the destination clock 145 is about 100 PPM. As noted, the minus one (−1) value corresponds to the rounded value of −1.33. Thus, in the FIG. 9 example, the initial phase setting of the clock select 217 corresponds to BIN8. Based on the weighted average value of −1.33, the decision circuit 215 will move the clock select 217 phase setting to minus one (−1) bin positions after the decision period. Thus, the clock select 217 phase setting will move from BIN8 to BIN7. The new destination clock 145 phase is represented by arrow 710 and by the dashed Gaussian distribution 715.

As a further example, assume the weighted average value of equation (1) is calculated to equal a rounded value of +1 after a decision period. The clock select 217 phase position will then move from its initial position of BIN8 to BIN9 after the decision period. This new clock select 217 phase is represented by arrow 720 and by the dashed Gaussian distribution 725.

As an additional example, assume the weighted average value of equation (1) is calculated to equal a rounded value of "0" after a decision period. The clock select 217 phase position will therefore not move from its initial position of BIN8 (as represented by arrow 700) after the decision period.

Figure 11:
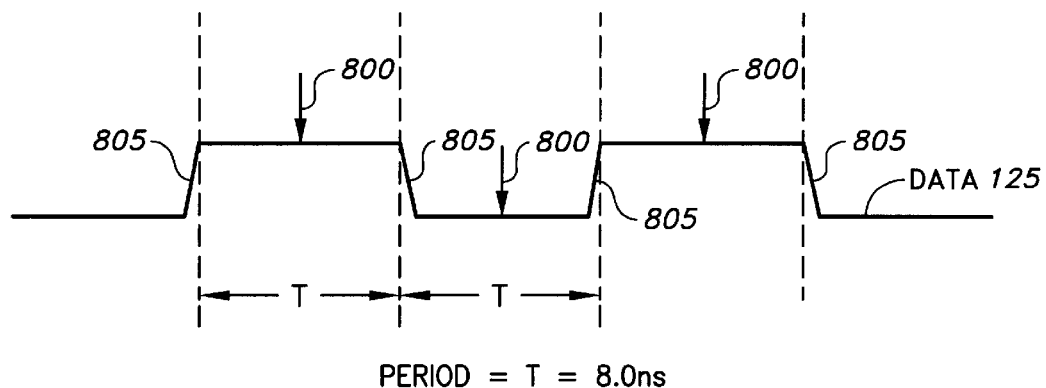
FIG. 11 shows a DATA signal for further illustrating the method of sampling based on weighted averaging.

Reference is now made to FIG. 11, which shows a DATA signal 125 for further illustrating the method of sampling based on weighted averaging. The DATA signal 125 of FIG. 11 has NRZI encoding and a period T of, for example, about 8.0 ns. As stated above, however, the DATA signal 125 can have other forms of encoding such as Manchester encoding. Ideally, the clock select phase setting is set such that sampling can occur in the bit midstream (as best shown by arrows 800). The bins BIN0 . . . BIN15 (FIG. 9) will record the transitions 805 of the DATA signal 125 for a decision period and the counter/accumulator 210 will calculate the weighted average value based on the above equation (1). Assuming an ideal condition exist wherein jitter is absent in the DATA signal 125, the weighted average calculation leads to a clock select 217 phase setting which corresponds to the bit midstream position 800. Ideal data recovery is achieved by sampling in the bit midstream position 800.

Figure 12:
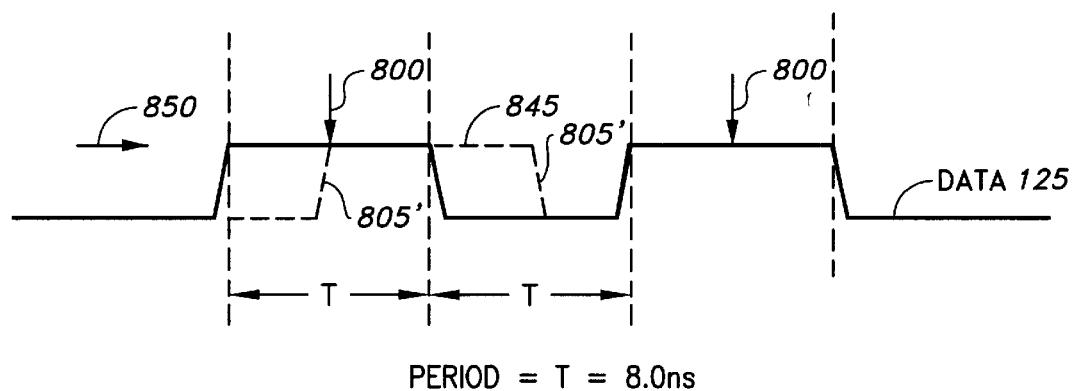
FIG. 12 shows how jitter may occur in the DATA signal, causing a bit to shift and how the calculated weighted average value takes into account the bit distributions of the DATA signal and maintain sampling at the bit midstream position.

An advantage provided by the invention is illustrated by the example of FIG. 12. Jitter may occur in the DATA signal 125 causing a bit (represented by dashed lines 845) to shift in the direction of arrow 850. The bins BIN0 . . . BIN15 will record the transitions 805' of the jittered bit 845, as well as transitions of other bits without jitter. The calculated weighted average value (determined by equation (1)) takes into account the bit distributions of the DATA signal 125 and maintain sampling at the bit midstream position 800. In contrast, a PLL in a conventional clock/data recovery system may lock onto a jittered bit 845 and accordingly adjust its phase based on the locked jittered bit. This results in an out-of-phase misalignment between the data recovery mechanism and the recovered data.

DATA STREAM WITH AN EDGE-STARVED CONDITION

Figure 13:
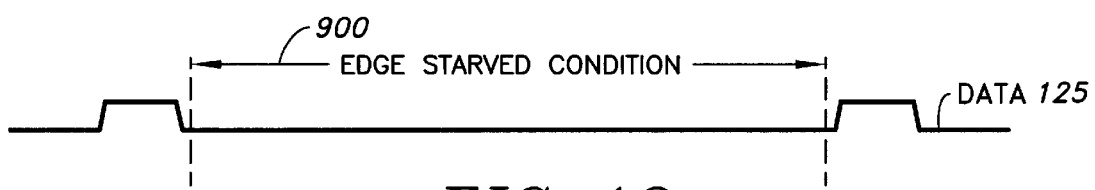
FIG. 13 shows a data stream which undergoes an "edge-starved condition" that with conventional clock/data recovery systems may cause an out-of-phase condition between the transmitting data and the data recovery mechanism.

FIG. 13 shows data stream signal 125 which undergoes an "edge-starved condition" (represented by double-headed arrows 900). Due to data and clock encoding schemes, non-uniformly spaced edges can occur in high-speed data and clock transmission systems. Such an example is the MLT3 encoding scheme used by the IEEE 802.3 standard for 100BX. Since two consecutive edges are separated by a non-uniform period, in a decision period of 800 ns, there could be a condition where very few or no edges occur. This condition is termed an edge-starved period or a period where there are not enough edge occurrences such that the weighted average, $V_{wavg}$, can be considered statistically meaningful. During this edge-starved period, the phase select changes can be made, if necessary, only based on past information as to how often the phase select was changing and in which direction (i.e., i was being incremented, Bin (i) to Bin (i+1) or i was decremented, Bin (i) to Bin (i−1)). The past information is kept and updated only based on periods of rich edge occurrences. The preferred number is 20 or greater. The frequency difference between the source clock and destination clock is measured in parts per million (PPM). For instance, if the source clock frequency is 125.000001 and the destination clock is 125.000000 MHz, then the difference is approximately 1 PPM. The preferred way to measure PPM difference in an ideal, non-jittered environment is to keep track of how often the phase select is moved. For instance, if the decision period is 800 ns, the phase select is moved every 3 sampling periods (i.e., every 2400 ns), and the ideal clock frequency is 125 MHz, then the PPM difference is approximately 200. The PPM tracking circuit shown later tracks a maximum PPM difference of +/−200 PPM in steps of 25 PPM. Note that the PPM information should only be used for phase select movement where there are not enough (i.e., 4–10) edges during a sampling period of 800 ns. The edge-starved condition 900 may be, for example, as long as sixty (60) bit times. Under conventional clock/data recovery systems, the edge-starved condition 900 may cause an out-of-phase condition between the transmitting data and the data recovery mechanism, since the edge-starved condition 900 may cause the PLL to drift.

The present invention solves the problems of conventional clock/data recovery system during an edge-starved condition 900. A circuit tracks and digitally stores the PPM difference between the source clock 114 and the destination clock 145. In FIG. 14, a flowchart 950 illustrates a mechanism for tracking and digitally storing the PPM difference between the source clock 114 and the destination clock 145.

If the mechanism of the flowchart 950 detects a 100 PPM or less difference between the source clock 114 and the destination clock 145, then the invention will count edge occurrence in the data stream signal 125 for 314 bit times and then perform weighted averaging (based on equation (1)) to determine the clock select 217 phase setting for tracking the frequency of the data stream signal 125.

However, if 200 PPM difference exist between the source clock 114 and the destination clock 145, then predictive phase adjustment is required for tracking the frequency of the data stream signal 125. The weighted averaging calculation requires sufficient edges in the data stream signal 125 to be detected for accurate phase adjustment, and thus weighted averaging accurately reflects the data stream signal 125 distribution if the decision period is sufficiently long (e.g., 314 bit times) to sample sufficient edges.

A 200 PPM difference between the source clock 114 and the destination clock 145 requires a shorter decision period for phase adjustment of the clock select. Therefore, under this condition, the invention relies on stored historical information to determine the required phase adjustment.

Thus, while the present invention has been described herein with reference to particular embodiments, it will be appreciated that some features of the invention can be employed without a corresponding use of other features and without departing from the scope of the invention.

What is claimed is:

1. A shared data and clock recovery circuit for processing a data stream generated using a source clock, the circuit comprising:
   (a) a clock synthesizer adapted to generate a plurality of sampling signals having different phases relative to a local clock;
   (b) a multiple transition detector adapted to detect edges in the data steam using the plurality of sampling signals;
   (c) a counter/accumulator adapted to generate (1) a weighted average difference between the local clock and the source clock and (2) the total number of edges detected in the data stream during a decision period; and
   (d) a decision circuit adapted to select one of the different phases of the plurality of sampling signals, wherein:
      when the total number of edges is greater than a specified threshold, the decision circuit is adapted to select one of the different phases based on the weighted average difference and update a stored difference based on the weighted average difference; and
      when the total number of edges is less than the specified threshold, the decision circuit is adapted to select one of the different phases based on the stored difference.

2. The circuit of claim 1, wherein the weighted average difference represents a parts-per-million (PPM) difference between the source clock and the local clock.

3. The circuit of claim 2, wherein:
   when the PPM difference exceeds a first threshold, the decision period is decreased; and
   when the PPM difference is less than a second threshold, the decision period is increased.

4. The circuit of claim 1, wherein a recovered clock is generated based on the selected one of the different phase.

5. The circuit of claim 1, wherein the selected one of the generated phases is used to sample the data stream to recover data from the data stream.

6. The circuit of claim 1, wherein weights used to generate the weighted average difference are updated based on the selected one of the different phases.

7. A method for processing a data stream generated using a source clock, the method comprising:
   (a) generating a plurality of sampling signals having different phases relative to a local clock;
   (b) detecting edges in the data stream using the plurality of sampling signals;
   (c) generating (1) a weighted average difference between the local clock and the source clock and (2) the total number of edges detected in the data stream during a decision period; and
   (d) selecting one of the different phases of the plurality of sampling signals, wherein:
      when the total number of edges is greater than a specified threshold, one of the different phases is selected based on the weighted average difference and a stored difference is updated based on the weighted average difference; and
      when the total number of edges is less than the specified threshold, one of the different phases is selected based on the stored difference.

8. The method of claim 7, wherein the weighted average difference represents a parts-per-million (PPM) difference between the source clock and the local clock.

9. The method of claim 8, wherein:
   when the PPM difference exceeds a first threshold, the decision period is decreased; and
   when the PPM difference is less than a second threshold, the decision period is increased.

10. The method of claim 7, wherein a recovered clock is generated based on the selected one of the different phases.

11. The method of claim 7, wherein the selected one of the generated phases is used to sample the data stream to recover data from the data stream.

12. The method of claim 7, wherein weights used to generate the weighted average difference are updated based on the selected one of the different phases.

* * * * *